United States Patent
Wills et al.

(10) Patent No.: US 7,313,490 B2
(45) Date of Patent: Dec. 25, 2007

(54) WAVELET ANALYSIS OF ONE OR MORE TIME DOMAIN REFLECTOMETRY (TDR) SIGNALS TO DETERMINE ONE OR MORE CHARACTERISTICS OF ONE OR MORE ANOMALIES IN A WIRE

(75) Inventors: Kendall S. Wills, Sugar Land, TX (US); Kartik Ramanujachar, Sugar Land, TX (US); Michael D. Dockins, Waxahachie, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/749,416

(22) Filed: Dec. 31, 2003

(65) Prior Publication Data

US 2005/0021256 A1 Jan. 27, 2005

Related U.S. Application Data

(60) Provisional application No. 60/486,663, filed on Jul. 11, 2003.

(51) Int. Cl.
*G01R 13/00* (2006.01)
*G06F 19/00* (2006.01)
(52) U.S. Cl. .......................... 702/66; 702/76
(58) Field of Classification Search ............. 702/35, 702/39, 57–59, 66, 73, 75, 76, 71, 189; 73/659, 73/660; 367/38, 104, 131; 324/637, 639
See application file for complete search history.

(56) References Cited

U.S. PATENT DOCUMENTS 6,311,130 B1 * 10/2001 Huang ........................ 702/2

2004/0230383 A1 * 11/2004 Bechhoefer et al. .......... 702/57

OTHER PUBLICATIONS

Michael Dockins, Texas Instruments, Inc., "Frequency Domain Analysis of Time Domain Reflectometry Signals," Aug. 9, 2002, 43 pages, Aug. 2, 2002.
Michael Dockins, "Affidavit of Michael D. Dockins," signed Jan. 15, 2004, 2 pages.
Dr. Krzysztof Michalski "Affidavit of Dr. Krzysztof Michalski," signed Jan. 15, 2004, 2 pages.

* cited by examiner

*Primary Examiner*—Bryan Bui
(74) *Attorney, Agent, or Firm*—Yingsheng Tung; Wade James Brady, III; Frederick J. Telecky, Jr.

(57) ABSTRACT

In one embodiment, a method for wavelet analysis of one or more time domain reflectometry (TDR) signals to determine one or more characteristics of one or more anomalies in a wire includes receiving a TDR signal that has reflected back up a wire from an anomaly in the wire, calculating a wavelet analysis result from a wavelet analysis of the TDR signal, accessing a library of one or more reference wavelet analysis results that each correspond to one or more known anomalies having one or more known characteristics, and comparing the wavelet analysis result with one or more reference wavelet analysis results. If the wavelet analysis result corresponds to one or more particular reference wavelet analysis results, it is indicated that the anomaly in the wire has one or more particular known characteristics of one or more particular known anomalies corresponding to the one or more particular reference wavelet analysis results. If the wavelet analysis result of the TDR signal does not correspond to one or more reference wavelet analysis results, it is indicated that the anomaly in the wire lacks one or more known characteristics of one or more known anomalies corresponding to one or more reference wavelet analysis results in the library.

23 Claims, 1 Drawing Sheet

WAVELET ANALYSIS OF ONE OR MORE TIME DOMAIN REFLECTOMETRY (TDR) SIGNALS TO DETERMINE ONE OR MORE CHARACTERISTICS OF ONE OR MORE ANOMALIES IN A WIRE

RELATED APPLICATION

This Application claims the benefit, under 35 U.S.C. § 119(e), of U.S. Provisional Application No. 60/486,663, filed Jul. 11, 2003.

TECHNICAL FIELD OF THE INVENTION

This invention relates generally to TDR signal analysis and more particularly to wavelet analysis of one or more TDR signals to determine one or more characteristics of one or more anomalies in a wire.

BACKGROUND

Previous techniques for analyzing one or more TDR signals include analyzing the TDR signals using a Fourier Transform (FT). However, FTs tend to be ineffective at analyzing TDR signals. A drawback of FTs is that, in an FT analysis of a function, the function is assumed to be periodic and to extend infinitely in a time domain. In contrast, a TDR signal is typically a critically damped pulsed signal that, in a time domain, has a rapidly rising leading edge. As a result, FTs cannot accurately represent such TDR signals.

SUMMARY OF THE INVENTION

According to the present invention, disadvantages and problems associated with analyzing one or more TDR signals may be reduced or eliminated.

In one embodiment, a method for wavelet analysis of one or more time domain reflectometry (TDR) signals to determine one or more characteristics of one or more anomalies in a wire includes receiving a TDR signal that has reflected back up a wire from an anomaly in the wire, calculating a wavelet analysis result from a wavelet analysis of the TDR signal, accessing a library of one or more reference wavelet analysis results that each correspond to one or more known anomalies having one or more known characteristics, and comparing the wavelet analysis result with one or more reference wavelet analysis results. If the wavelet analysis result corresponds to one or more particular reference wavelet analysis results, it is indicated that the anomaly in the wire has one or more particular known characteristics of one or more particular known anomalies corresponding to the one or more particular reference wavelet analysis results. If the wavelet analysis result of the TDR signal does not correspond to one or more reference wavelet analysis results, it is indicated that the anomaly in the wire lacks one or more known characteristics of one or more known anomalies corresponding to one or more reference wavelet analysis results in the library.

Particular embodiments of the present invention may provide one or more technical advantages. Particular embodiments may facilitate analysis of frequency content of one or more TDR signals. Particular embodiments may be used to more accurately determine one or more characteristics of one or more anomalies in a wire. Certain embodiments may provide all, some, or none of these technical advantages. Certain embodiments may provide one or more other technical advantages, one or more of which may be readily apparent to those skilled in the art from the figures, descriptions, and claims herein.

BRIEF DESCRIPTION OF THE DRAWINGS

To provide a more complete understanding of the present invention and the features and advantages thereof, reference is made to the following description, taken in conjunction with the accompanying drawings, in which.

DESCRIPTION OF EXAMPLE EMBODIMENTS

Figure 1:
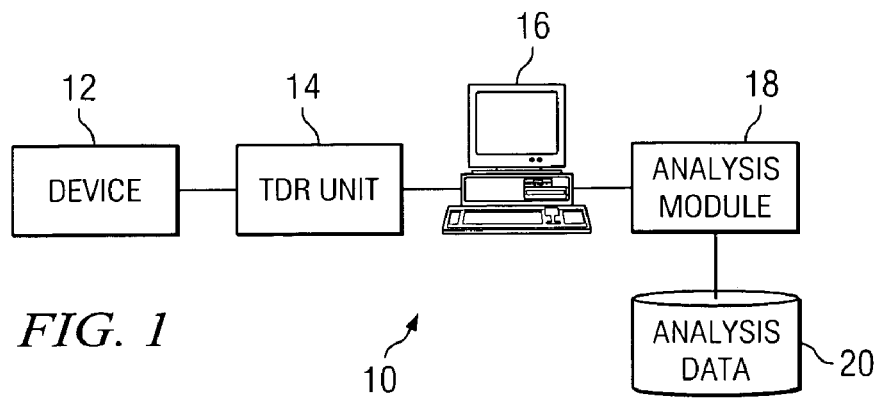
FIG. 1 illustrates an example system for wavelet analysis of one or more TDR signals to determine one or more characteristics of one or more anomalies in a wire.

FIG. 1 illustrates an example system 10 for wavelet analysis of one or more TDR signals to determine one or more characteristics of one or more anomalies in a wire. System 10 includes a device 12, a TDR unit 14, a computer system 16, an analysis module 18, and analysis data 20. Device 12 is any suitable device including one or more wires (which may each include one or more conductive links coupling two or more components of device 12 to each other) for testing. As an example, in particular embodiments, device 12 is an integrated circuit (IC) package including one or more wires coupling input and output pins to solder bumps for electrically coupling the IC package to a die. As another example, in particular embodiments, device 12 is a die including one or more wires linking a land of the die (which may be coupled to a solder bump of an IC package) to one or more components of an IC in the die. Although particular devices 12 including particular wires are described, the present invention contemplates any suitable device 12 including any suitable wires.

Analysis module 18 may be a component of computer system 16 or a device separate from computer system 16. Analysis module 18 may include software, hardware, or both for analyzing TDR signals. As an example, in particular embodiments, analysis module 18 may include TDA SYSTEMS software for TDR analysis or MATLAB or other suitable mathematical analysis tool. Analysis data 20 may include data that may be used to analyze one or more TDR signals, as described below. TDR unit 14 may communicate one or more TDR signals down a wire of device 12, receive one or more portions of the TDR signals reflected back up the wire from one or more anomalies in the wire, and record the TDR signals for analysis. "TDR signal" encompasses a TDR signal communicated down a wire, one or more portions of the TDR signal reflected back up the wire, or both, where appropriate. An anomaly in a wire may include oxidation in the wire, a narrowing of the wire (which may result in an increase in resistance of the wire), an open in the wire (which may contain air, oxide, metal, or other contents), a short in the wire (which may be total or resistive), a filament protruding from the wire, proximity between the wire and another wire, or other anomaly. After TDR unit 14 records the TDR signals, TDR unit 14 may (automatically or in response to input from computer system 16 or a user) communicate the TDR signals to computer system 16 for analysis.

Computer system 16 and analysis module 18 may then analyze the TDR signals to determine whether the wire includes one or more anomalies. In particular embodiments, computer system 18 may analyze the TDR signals automatically or in response to input from a user. If the wire includes an anomaly, the TDR signals may be analyzed to determine one or more characteristics of the anomaly, as described below. In particular embodiments, this information may be combined with information regarding the location of the defect (including the distance down the wire of the anomaly and x, y, and z coordinates of the anomaly relative to device 12) to obtain a more complete description of the anomaly. According to previous techniques, the return time of the TDR signal may be used to determine the distance of the anomaly down the wire from the point of input of the TDR signal into the wire. The return time includes the amount of time it takes the TDR signal to travel down the wire from the point of input to the anomaly and back up the wire from the anomaly to the point of input. The distance of the anomaly down the wire is equal to half the return time of the TDR signal. When this distance is measured, a length of an input line from TDR unit 14 to device 12 may need to be accounted for. After this distance has been determined, a diagram of the die or package may be used to determine x, y, and z coordinates of the anomaly with respect to device 12, according to previous techniques.

An electrical signal communicated through a wire may have a known speed. As a result, distance in a wire may be described in terms of time. For example, seventeen picoseconds may indicate one hundred microns of distance in a wire. Similarly, wavelength of an electrical signal may be described in terms of time. For example, an electrical signal for examining an IC package may have a wavelength of approximately thirty-two picoseconds. Such an electrical signal may provide a resolution of approximately seventeen picoseconds (which corresponds to approximately one hundred microns). Because die-level structures are smaller than IC package-level structures, an electrical signal with a shorter wavelength (resulting in a faster pulse and higher rise time) may be used to examine components of a die.

An anomaly in a wire may cause a change in impedance (which includes resistance, capacitance, and inductance) in the wire at the anomaly. For example, a bend in the wire may change inductance in the wire. Proximity between the wire and another wire may change capacitance in the wire. A narrowing of the wire may change resistance in the wire. An open in the wire may change resistance, capacitance, and inductance in the wire. The changes in capacitance and inductance may be due to coupling between the wire and contents of the open. When a TDR signal communicated down the wire encounters the change in impedance in the wire at the anomaly, all or a portion of the TDR signal may be reflected back up the wire. In addition, when a TDR signal is reflected back up a wire from a particular change in impedance caused by an anomaly having one or more particular characteristics, the TDR signal may contain information regarding those particular characteristics of the anomaly. Frequency content of the TDR signal may contain at least some of this information.

As an example and not by way of limitation, if the anomaly is an open in the wire and the open is wide enough to prevent tunneling, the entire TDR signal (which may include all energy in the TDR signal communicated down the wire) may be reflected back up the wire. On the other hand, if the open is narrow enough to allow tunneling, only a portion of the TDR signal (which may include only a certain portion of the energy in the TDR signal communicated down the wire) may be reflected back up the wire, which may be a result of energy dissipation in the TDR signal at the open. In addition to the width of the open affecting the TDR signal, contents of the open may also affect the TDR signal. As an example and not by way of limitation, if the contents of the open include oxide, coupling may occur between the wire and the oxide. Different contents may have different coupling effects, and the coupling effect of the contents of the open may create a particular signature in noise generated in the TDR signal reflected back up the wire. Although particular characteristics of a particular anomaly are described as affecting a TDR signal in a particular manner, the present invention contemplates any suitable characteristic of any suitable anomaly affecting a TDR signal in any suitable manner. A characteristic of an anomaly may include a nature of the anomaly, a size of the anomaly, a shape of the anomaly, contents of the anomaly (if any), or other characteristic.

Previous techniques for analyzing frequency content of TDR signals include analyzing TDR signals using an FT, such as a Fast FT (FFT). However, certain disadvantages are associated with FFTs. An FFT of a TDR signal requires that the TDR signal be segmented and that the FFT be sequentially applied to segments of the TDR signal. In addition, an FFT of a TDR signal assumes that sinusoidal basis functions are alone adequate to reconstruct the TDR signal, which is often not the case. In contrast, in particular embodiments, wavelet analysis is used to analyze frequency content of a TDR signal. Wavelet analysis allows one or more basis functions for reconstructing the TDR signal to be selected according to one or more particular characteristics (such as one or more time characteristics, shape characteristics, or both) of the TDR signal. Unlike FTs, wavelet transforms are not limited to sinusoidal basis functions. As described below, in particular embodiments, a wavelet power spectrum of a TDR signal reflected back up a wire from an anomaly in the wire may be used to determine one or more characteristics of the anomaly.

In wavelet analysis of a TDR signal, the TDR signal may be analyzed across multiple time scales, which may provide multiresolution capability. In particular embodiments, a continuous wavelet transform may be applied, across multiple wavelet scales, to the TDR signal using a Morlet or other basis function. A wavelet power spectrum may be calculated that accounts for the TDR signal across all wavelet scales used in the analysis. A wavelet scale corresponds to frequency in FT analysis. At different wavelet scales, a TDR signal may include various signal levels (which may be measured in volts or ohms). These signal levels across these wavelet scales constitute a wavelet power spectrum of the TDR signal. To calculate a wavelet power spectrum of a TDR signal, a wavelet transform of the TDR may first be calculated using a Morlet or other suitable basis function. The wavelet coefficients of the TDR signal may each be a function of wavelet scale. The wavelet coefficients may indicate a degree of similarity between the TDR signal and basis function used to reconstruct the TDR signal. As an example, in a plot of the wavelet transform, a brightness of one or more certain regions of the plot may indicate this similarity. A wavelet power spectrum of the TDR signal may then be calculated and plotted using the wavelet coefficients of the wavelet transform. The wavelet power spectrum may be conceptually analogous to a Fourier power spectrum. In particular embodiments, the wavelet power spectrum may be plotted along an x axis that includes a range of wavelet scales and a y axis may include a range of averages of squared wavelet coefficients across all samples at a certain wavelet scale.

In particular embodiments, an anomaly in a wire may have a distinctive wavelet power spectrum that may be used to determine one or more characteristics of the anomaly. As an example, consider a first wavelet power spectrum corresponding to an anomaly in a wire. The first wavelet power spectrum may be compared with one or more second wavelet power spectra from a library of wavelet power spectra that correspond to known anomalies having known characteristics. This library may be developed through empirical studies of various anomalies in various wires. Analysis data 20 may contain this library. If the first wavelet power spectrum corresponds to one or more second wavelet power spectra corresponding to one or more particular known anomalies having one or more particular known characteristics, it may be concluded that the anomaly in the wire has the one or particular known characteristics of the one or more particular known anomalies. Any suitable aspects of the wavelet power spectrum may be used to determine whether the first wavelet power spectrum corresponds to one or more second wavelet power spectra. As an example, a location of a peak in a plot of the wavelet power spectrum with respect to an x axis, a y axis, or both may be used to make this determination. In particular embodiments, one or more suitable statistical analysis techniques may be used to determine whether the first power spectrum corresponds to one or more second power spectra. One or more such techniques may estimate a probability that a peak from a wavelet power spectrum is significant with respect to a background spectrum. In addition or as an alternative, a parameter estimation statistical analysis technique may be used to determine whether the first power spectrum corresponds to one or more second power spectra.

Figure 2:
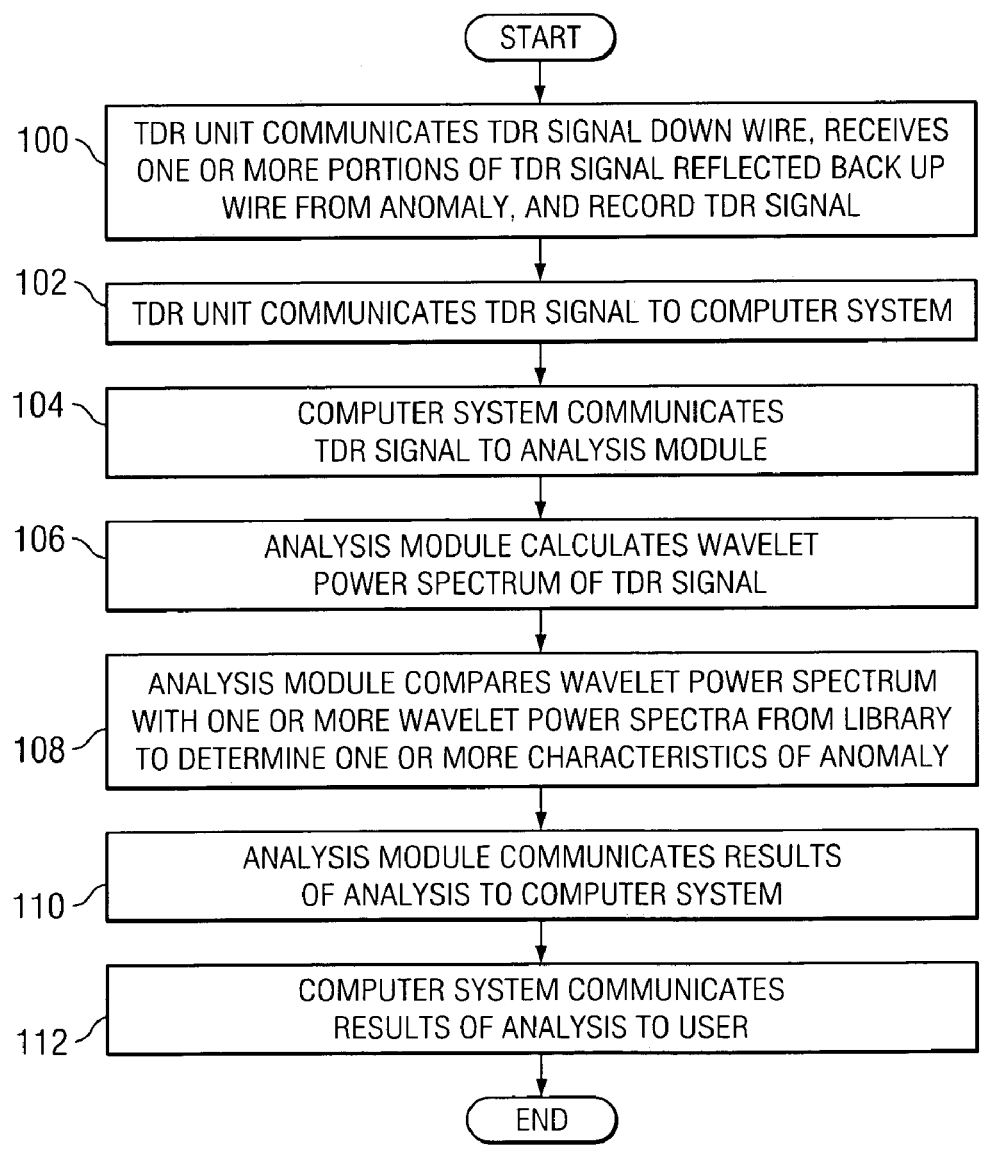
FIG. 2 illustrates an example method for wavelet analysis of one or more TDR signals to determine one or more characteristics of one or more anomalies in a wire.

FIG. 2 illustrates an example method for wavelet analysis of one or more TDR signals to determine one or more characteristics of one or more anomalies in a wire. The method begins at step 100, where TDR unit 14 communicates a TDR signal down a wire of device 12, receives one or more portions of the TDR signal reflected back up the wire from an anomaly in the wire, and records the TDR signal. At step 102, TDR unit 14 communicates the TDR signal to computer system 16. At step 104, computer system 16 communicates the TDR signal to analysis module 18 for analysis. At step 106, analysis module 18 calculates a wavelet power spectrum of the TDR signal, as described above. At step 108, analysis module 18 compares the wavelet power spectrum of the TDR signal with one or more wavelet power spectra from a library of wavelet power spectra to determine one or more characteristics of the anomaly in the wire. As described above, this library may be developed through empirical studies of various anomalies in various wires. Analysis data 20 may include the library of wavelet power spectra. In particular embodiments, wavelet power spectra in the library may each correspond to one or more known anomalies having one or more particular characteristics.

If the wavelet power spectrum of the TDR signal more or less matches a particular wavelet power spectrum in the library corresponding to a particular known anomaly having one or more particular known characteristics, it may be concluded that the anomaly in the wire has the one or more particular known characteristics. In particular embodiments, one or more wavelet power spectra in the library each include a combination (such as an average) of two or more wavelet power spectra corresponding to two or more anomalies having one or more known characteristics. In particular embodiments, one or more suitable statistical analysis techniques may be used to determine whether the wavelet power spectrum of the TDR signal corresponds to one or more power spectra in the library. At step 110, analysis module 18 communicates results of the analysis to computer system 16. At step 112, computer system 16 communicates the results to one or more users, at which point the method ends.

Although the present invention has been described with several embodiments, myriad changes, variations, alterations, transformations, and modifications may be suggested to one skilled in the art, and it is intended that the present invention encompass such changes, variations, alterations, transformations, and modifications as fall within the scope of the appended claims. The present invention is not intended to be limited, in any way, by any statement in the specification that is not reflected in the claims.

What is claimed is:

1. A system for wavelet analysis of one or more time domain reflectometry (TDR) signals to determine one or more characteristics of one or more anomalies in a wire, the system comprising:
   a library of one or more reference wavelet analysis results that each correspond to one or more known anomalies having one or more known characteristics; and
   an analysis module operable to:
      receive a TDR signal that has reflected back up a wire from an anomaly in the wire;
      calculate a wavelet analysis result from a wavelet analysis of the TDR signal;
      access the library;
      compare the wavelet analysis result with one or more reference wavelet analysis results; and
      responsive to the wavelet analysis result corresponding to one or more particular reference wavelet analysis results, indicate that the anomaly in the wire has one or more particular known characteristics of one or more particular known anomalies corresponding to the one or more particular reference wavelet analysis results.

2. The system of claim 1, wherein the wavelet analysis result comprises a wavelet power spectrum of the TDR signal and the reference wavelet analysis results each comprise one or more reference wavelet power spectra.

3. The system of claim 2, wherein a wavelet transform is used to calculate the wavelet power spectrum of the TDR signal.

4. The system of claim 1, wherein a location of the anomaly is determined according to the TDR signal.

5. The system of claim 1, wherein an integrated circuit (IC) package comprises the wire.

6. The system of claim 1, wherein the analysis module is further operable to:
   indicate that the anomaly in the wire lacks one or more known characteristics of one or more known anomalies corresponding to one or more reference wavelet analysis results in the library, responsive to the wavelet analysis result not corresponding to one or more reference wavelet analysis results.

7. A method for wavelet analysis of one or more time domain reflectometry (TDR) signals to determine one or more characteristics of one or more anomalies in a wire, the method comprising:
   receiving a TDR signal that has reflected back up a wire from an anomaly in the wire;
   calculating a wavelet analysis result from a wavelet analysis of the TDR signal;
   accessing a library of one or more reference wavelet analysis results that each correspond to one or more known anomalies having one or more known characteristics;
   comparing the wavelet analysis result with one or more reference wavelet analysis results; and
   responsive to the wavelet analysis result corresponding to one or more particular reference wavelet analysis results, indicating that the anomaly in the wire has one or more particular known characteristics of one or more particular known anomalies corresponding to the one or more particular reference wavelet analysis results.

8. The method of claim 7, wherein the wavelet analysis result comprises a wavelet power spectrum of the TDR signal and the reference wavelet analysis results each comprise one or more reference wavelet power spectra.

9. The method of claim 8, wherein a wavelet transform is used to calculate the wavelet power spectrum of the TDR signal.

10. The method of claim 7, wherein a location of the anomaly is determined according to the TDR signal.

11. The method of claim 7, wherein an integrated circuit (IC) package comprises the wire.

12. The method of claim 7, further comprising:
indicating that the anomaly in the wire lacks one or more known characteristics of one or more known anomalies corresponding to one or more reference wavelet analysis results in the library, responsive to wavelet analysis result not corresponding to one or more reference wavelet analysis results.

13. The method of claim 7, wherein the indicating step comprises:
communicating results indicating that the anomaly in the wire has one or more particular known characteristics of one or more particular known anomalies corresponding to the one or more particular reference wavelet analysis results, responsive to the wavelet analysis result corresponding to one or more particular reference wavelet analysis results.

14. Software for wavelet analysis of one or more time domain reflectometry (TDR) signals to determine one or more characteristics of one or more anomalies in a wire, the software embodied in a computer-readable medium and when executed operable to:
receive a TDR signal that has reflected back up a wire from an anomaly in the wire; calculate a wavelet analysis result from a wavelet analysis of the TDR signal;
access a library of one or more reference wavelet analysis results that each correspond to one or more known anomalies having one or more known characteristics;
compare the wavelet analysis result with one or more reference wavelet analysis results; and
responsive to the wavelet analysis result corresponding to one or more particular reference wavelet analysis results, indicate that the anomaly in the wire has one or more particular known characteristics of one or more particular known anomalies corresponding to the one or more particular reference wavelet analysis results.

15. The software of claim 14, wherein the wavelet analysis result comprises a wavelet power spectrum of the TDR signal and the reference wavelet analysis results each comprise one or more reference wavelet power spectra.

16. The software of claim 14, wherein a location of the anomaly is determined according to the TDR signal.

17. The software of claim 14, wherein an integrated circuit (IC) package comprises the wire.

18. The software of claim 14, wherein the software when executed is further operable to:
indicate that the anomaly in the wire lacks one or more known characteristics of one or more known anomalies corresponding to one or more reference wavelet analysis results in the library, responsive to the wavelet analysis result not corresponding to one or more reference wavelet analysis results.

19. The software of claim 14, wherein the software when executed is further operable to:
communicate results indicating that the anomaly in the wire has one or more particular known characteristics of one or more particular known anomalies corresponding to the one or more particular reference wavelet analysis results, responsive to the wavelet analysis result corresponding to one or more particular reference wavelet analysis results.

20. A system for wavelet analysis of one or more time domain reflectometry (TDR) signals to determine one or more characteristics of one or more anomalies in a wire, the system comprising:
means for receiving a TDR signal that has reflected back up a wire from an anomaly in the wire; means for calculating a wavelet analysis result from a wavelet analysis of the TDR signal;
means for accessing a library of one or more reference wavelet analysis results that each correspond to one or more known anomalies having one or more known characteristics;
means for comparing the wavelet analysis result with one or more reference wavelet analysis results; and
means for indicating that the anomaly in the wire has one or more particular known characteristics of one or more particular known anomalies corresponding to the one or more particular reference wavelet analysis results, responsive to the wavelet analysis result corresponding to one or more particular reference wavelet analysis results.

21. The system of claim 20, further comprising:
means for indicating that the anomaly in the wire lacks one or more known characteristics of one or more known anomalies corresponding to one or more reference wavelet analysis results in the library, responsive to the wavelet analysis result not corresponding to one or more reference wavelet analysis results.

22. A system for wavelet analysis of one or more time domain reflectometry (TDR) signals to determine one or more characteristics of one or more anomalies in a wire, the system comprising:
a library of one or more reference wavelet power spectra that each correspond to one or more known anomalies having one or more known characteristics; and
an analysis module operable to:
receive a TDR signal that has reflected back up a wire from an anomaly in the wire;
calculate a wavelet power spectrum from a wavelet analysis of the TDR signal using a Morlet basis function;
access the library;
compare the wavelet power spectrum with one or more reference wavelet power spectra;
responsive to the wavelet power spectrum of the TDR signal corresponding to one or more particular reference wavelet power spectra, indicate that the anomaly in the wire has one or more particular known characteristics of one or more particular known anomalies corresponding to the one or more particular reference wavelet power spectra.

23. The system of claim 22, wherein the analysis module is further operable to:
indicate that the anomaly in the wire lacks one or more known characteristics of one or more known anomalies corresponding to one or more reference wavelet power spectra in the library, responsive to the wavelet power spectrum of the TDR signal not corresponding to one or more reference wavelet power spectra.

* * * * *